US012642150B2

(12) United States Patent
Tsai et al.

(10) Patent No.: US 12,642,150 B2
(45) Date of Patent: May 26, 2026

(54) POWER SEMICONDUCTOR PACKAGE SIGNAL CONNECTION COMPONENT AND SEMICONDUCTOR MODULE

(71) Applicant: ACTRON TECHNOLOGY CORPORATION, Taoyuan City (TW)

(72) Inventors: Hsin-Chang Tsai, Taoyuan City (TW); Ching-Wen Liu, Taoyuan City (TW); Ting-Ling Chen, Taoyuan City (TW)

(73) Assignee: ACTRON TECHNOLOGY CORPORATION, Taoyuan City (TW)

( * ) Notice: Subject to any disclaimer, the term of this patent is extended or adjusted under 35 U.S.C. 154(b) by 490 days.

(21) Appl. No.: 18/178,516

(22) Filed: Mar. 5, 2023

(65) Prior Publication Data

US 2024/0274515 A1 Aug. 15, 2024

(30) Foreign Application Priority Data

Feb. 9, 2023 (TW) .................................. 112104573

(51) Int. Cl.
H10W 40/25 (2026.01)
H10W 20/20 (2026.01)
H10W 90/00 (2026.01)

(52) U.S. Cl.
CPC ......... H10W 90/701 (2026.01); H10W 20/20 (2026.01); H10W 40/255 (2026.01)

(58) Field of Classification Search
CPC .......... H01L 23/49811; H01L 23/3735; H10W 90/701; H10W 40/255
See application file for complete search history.

(56) References Cited

U.S. PATENT DOCUMENTS

| | | | |
|---|---|---|---|
| 8,087,943 B2 | 1/2012 | Stolze | |
| 9,876,293 B2 | 1/2018 | Onishi et al. | |
| 2009/0194884 A1 | 8/2009 | Stolze | |
| 2011/0121450 A1* | 5/2011 | Tsukada .............. | H10W 70/635 |
| | | | 257/737 |
| 2016/0380366 A1 | 12/2016 | Onishi et al. | |
| 2018/0279484 A1 | 9/2018 | Kai et al. | |

FOREIGN PATENT DOCUMENTS

| | | | |
|---|---|---|---|
| CN | 109300872 | 2/2019 | |
| CN | 212517187 | 2/2021 | |
| CN | 212517187 U | * 2/2021 | |
| CN | 113035790 A | * 6/2021 | ....... H01L 23/49844 |

OTHER PUBLICATIONS

"Office Action of Japan Counterpart Application", issued on Jun. 11, 2024, p. 1-p. 3.
"Office Action of France Counterpart Application", issued on May 27, 2025, p. 1-p. 9.

* cited by examiner

*Primary Examiner* — Michele Fan
(74) *Attorney, Agent, or Firm* — JCIPRNET

(57) ABSTRACT

A power semiconductor package signal connection component includes a cylinder having a first through hole and two bases respectively disposed on opposite sides of the cylinder. Each base includes a continuous protrusion pattern and has a flat surface, a curved surface, and a second through hole. The flat surface is connected to the curved surface, and a first side of the curved surface is connected to the cylinder. The second through hole runs through the curved surface and communicates with the first through hole. The continuous protrusion pattern is connected to a second side of the curved surface and is located on the flat surface.

10 Claims, 4 Drawing Sheets

100a

POWER SEMICONDUCTOR PACKAGE SIGNAL CONNECTION COMPONENT AND SEMICONDUCTOR MODULE

CROSS-REFERENCE TO RELATED APPLICATION

This application claims the priority benefit of Taiwan application serial no. 112104573, filed on Feb. 9, 2023. The entirety of the above-mentioned patent application is hereby incorporated by reference herein and made a part of this specification.

BACKGROUND

Technical Field

The disclosure relates to a power semiconductor package signal connection component and a semiconductor module, and in particular, to a power semiconductor package signal connection component having a continuous protrusion pattern and a semiconductor module using the power semiconductor package signal connection component.

Description of Related Art

Power modules usually use connection components to connect signals between laminate substrates (such as direct bonded copper (DBC) substrates) and press-fit pins. The current connection components are connected to the laminate substrate through soldering. The surface of the connection component contacting solder is a completely flat surface, so the solder may easily run into the cylinder of the connection component due to pressing, which leads to an insufficient thickness of the solder volume and prevents the external terminal from being electrically connected to the laminate substrate through the cylinder, thereby resulting in poor reliability.

SUMMARY

The disclosure provides a power semiconductor package signal connection component, which includes a continuous protrusion pattern and may effectively increase a thickness of solder in subsequent applications.

The disclosure also provides a semiconductor module, which includes the above-mentioned power semiconductor package signal connection component and may increase the thickness of the solder and has a more favorable structural reliability.

A power semiconductor package signal connection component of the disclosure includes a cylinder having a first through hole and two bases disposed on opposite sides of the cylinder. Each base includes a continuous protrusion pattern and has a flat surface, a curved surface, and a second through hole. The flat surface is connected to the curved surface, and a first side of the curved surface is connected to the cylinder. The second through hole runs through the curved surface and communicates with the first through hole. The continuous protrusion pattern is connected to a second side of the curved surface and is located on the flat surface.

In an embodiment of the disclosure, the above-mentioned continuous protrusion pattern includes multiple protrusion portions and multiple connecting portions. The protrusion portions and the connecting portions are alternately connected to form a continuous pattern.

In an embodiment of the disclosure, the above-mentioned protrusion portions of the continuous protrusion pattern of each base and a peripheral edge of each base are arranged at intervals.

In an embodiment of the disclosure, the protrusion portion of the above-mentioned continuous protrusion pattern of each base are connected to the peripheral edge of each base.

In an embodiment of the disclosure, a side of the above-mentioned continuous protrusion pattern away from the curved surface is presented as an arc profile.

In an embodiment of the disclosure, an extension direction of the cylinder is perpendicular to an extension direction of each base.

In an embodiment of the disclosure, the peripheral edge of each above-mentioned base and a peripheral edge of the cylinder are separated by a horizontal distance.

In an embodiment of the disclosure, there is a height difference between the first side and the second side of the curved surface.

A semiconductor module of the disclosure includes a laminate substrate having a contact surface, a power semiconductor package signal connection component disposed on the contact surface of the laminate substrate and including a cylinder and two bases, and solder. The cylinder has a first through hole. The bases are disposed on opposite sides of the cylinder. Each base includes a continuous protrusion pattern and has a flat surface, a curved surface, and a second through hole. The flat surface is connected to the curved surface, and a first side of the curved surface is connected to the cylinder. The second through hole runs through the curved surface and communicates with the first through hole. The continuous protrusion pattern is connected to a second side of the curved surface and is located on the flat surface. Solder is disposed between one of the two bases of the power semiconductor package signal connection component and the laminate substrate. The continuous protrusion pattern of one of the two bases directly contacts the solder and the continuous protrusion pattern and the laminate substrate are arranged at intervals.

In an embodiment of the disclosure, the above laminate substrate includes an insulation layer, a wiring layer, and a metal layer. The insulation layer has a first surface and a second surface opposite to each other. The wiring layer is disposed on the first surface of the insulation layer and has a contact surface. The metal layer is disposed on the second surface of the insulation layer.

Based on the above, in the power semiconductor package signal connection component of the disclosure, the base includes a continuous protrusion pattern. The continuous protrusion pattern is connected to the curved surface and is located on the flat surface. That is, the dispositions of the continuous protrusion pattern and the flat surface enable the base to have a concave-convex plane with inner convex and outer concave. Therefore, when the solder is placed between the base of the power semiconductor package signal connection component and the laminate substrate in subsequent applications, the concave-convex plane may not only increase the thickness of the solder between the power semiconductor package signal connection component and the laminate substrate, but also reduce/avoid the solder from entering the cylinder and reduce the stress on the solder. Thus, the power semiconductor package signal connection component of the disclosure may effectively increase the thickness of the solder in subsequent applications, and the semiconductor module using the power semiconductor package signal connection component of the disclosure may have a more favorable structural reliability.

In order to make the above-mentioned features and advantages of the disclosure clearer and easier to understand, the following specific embodiments are given and described in details with accompanying drawings as follows.

DESCRIPTION OF THE EMBODIMENTS

Figure 1:
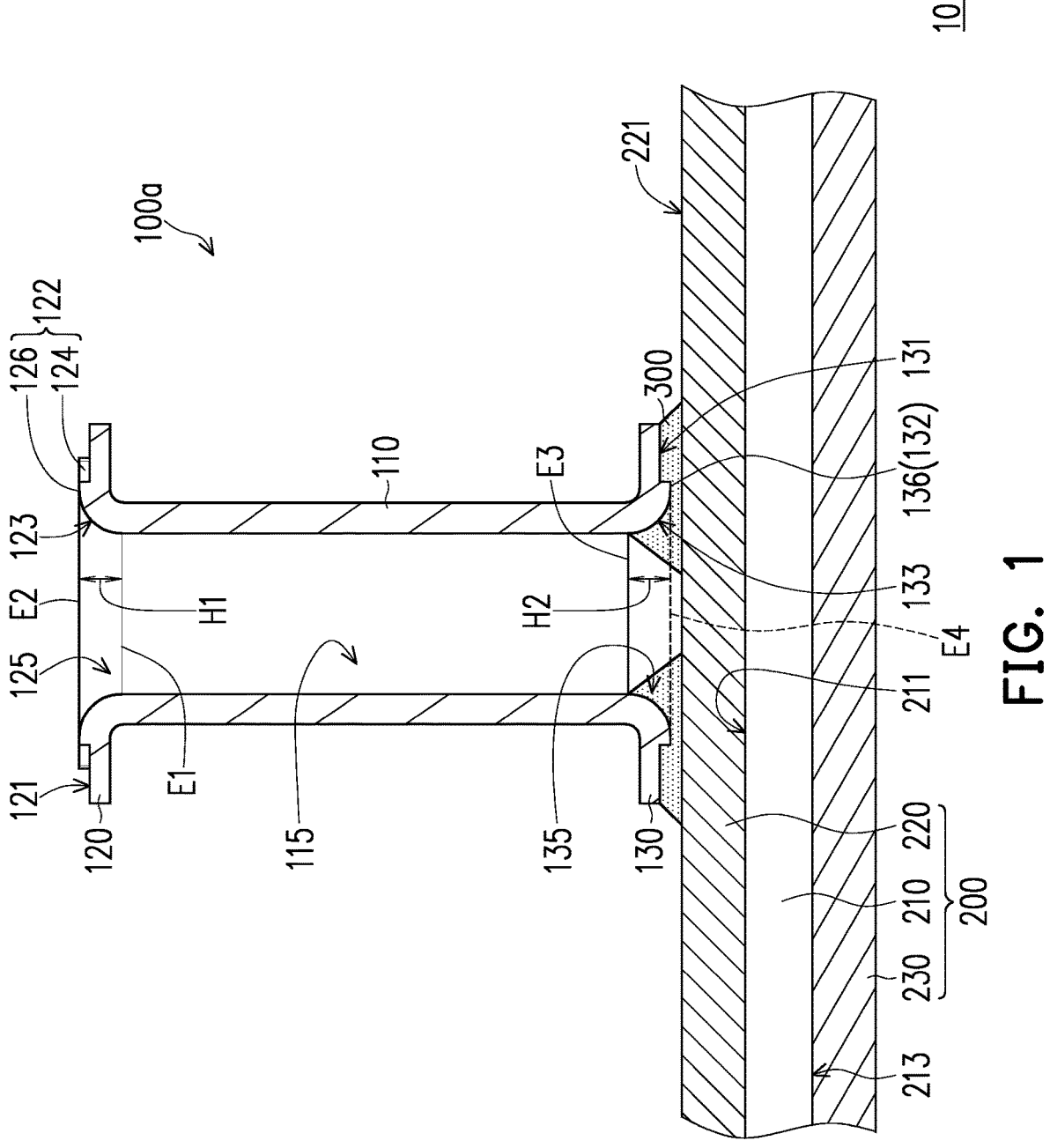
FIG. 1 is a schematic cross-sectional view of a semiconductor module according to an embodiment of the disclosure.
Figure 2A:
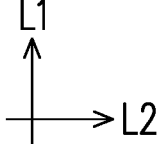
FIG. 2A is a schematic perspective view of the power semiconductor package signal connection component of FIG. 1.
Figure 2A:
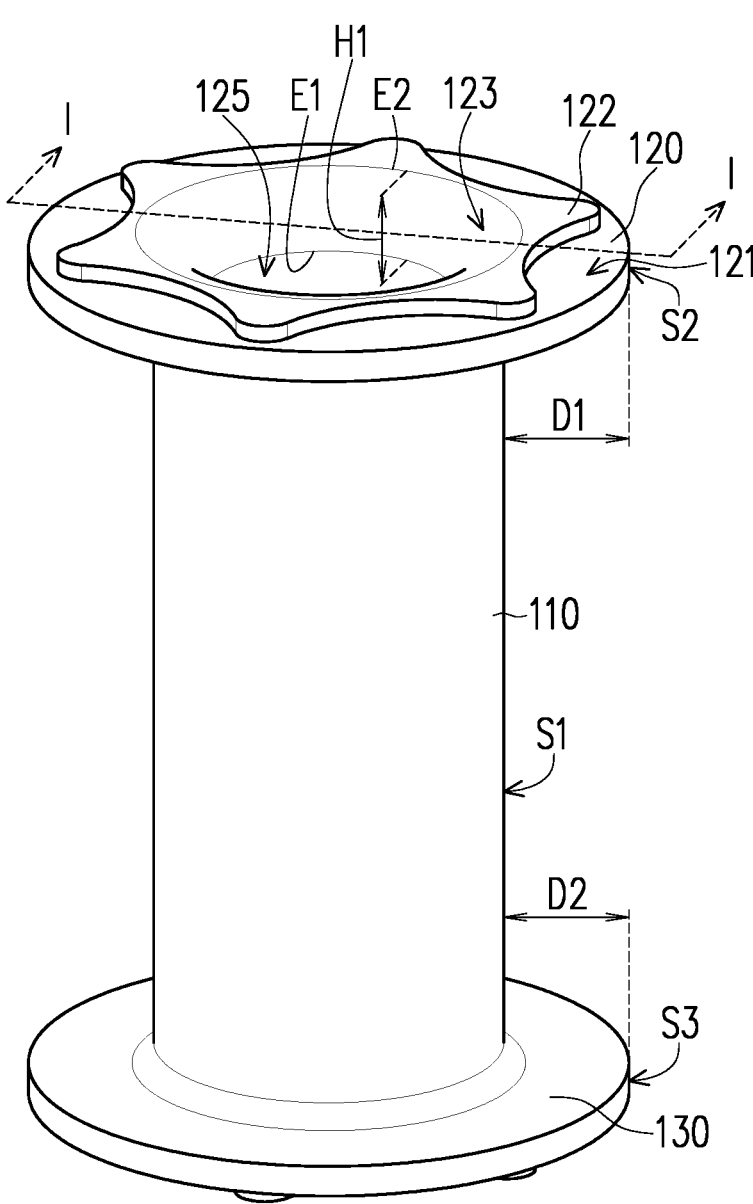
Figure 2B:
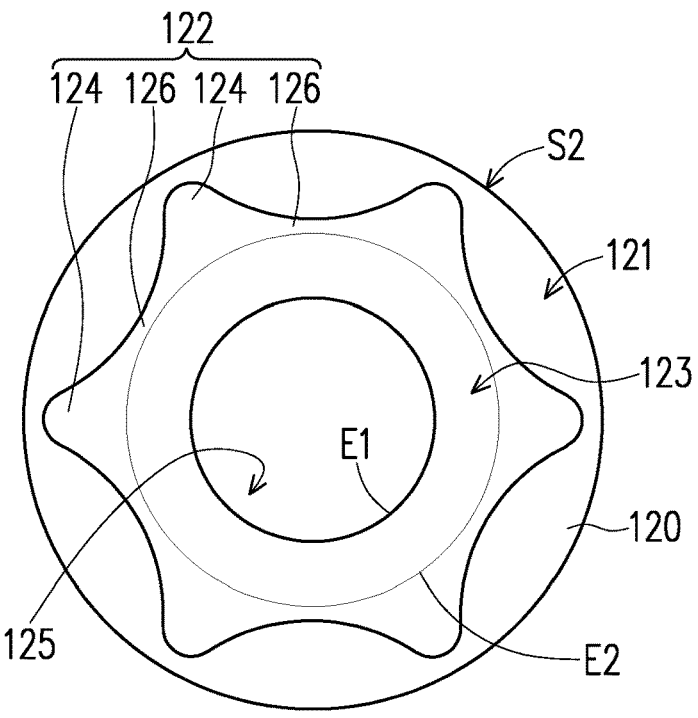
FIG. 2B is a schematic top view of the power semiconductor package signal connection component of FIG. 2A.
Figure 2C:
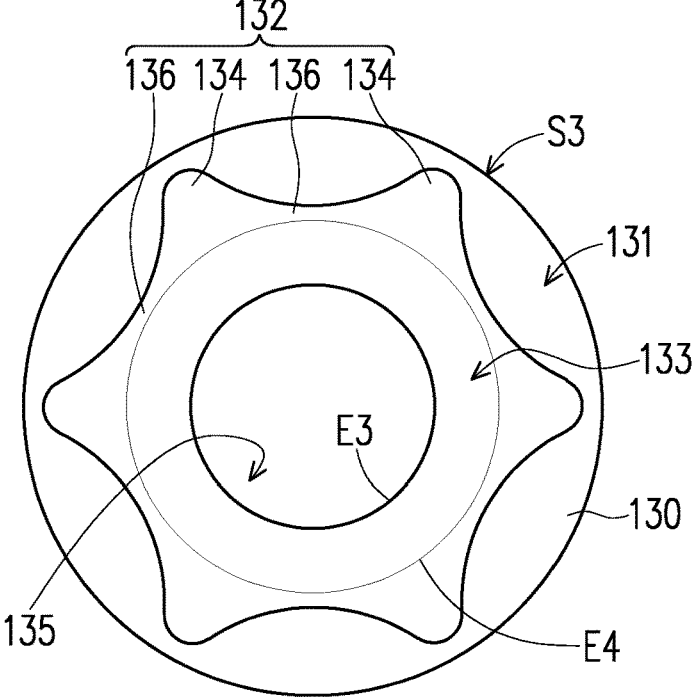
FIG. 2C is a schematic bottom view of the power semiconductor package signal connection component of FIG. 2A.

FIG. 1 is a schematic cross-sectional view of a semiconductor module according to an embodiment of the disclosure. FIG. 2A is a schematic perspective view of the power semiconductor package signal connection component of FIG. 1. FIG. 2B is a schematic top view of the power semiconductor package signal connection component of FIG. 2A. FIG. 2C is a schematic bottom view of the power semiconductor package signal connection component of FIG. 2A. It should be noted that the cross-sectional view of the power semiconductor package signal connection component in FIG. 1 is taken along line I-I in FIG. 2A.

Please refer to FIG. 1 first. In the embodiment, a semiconductor module 10 includes a laminate substrate 200, a power semiconductor package signal connection component 100a, and a solder 300. The power semiconductor package signal connection component 100a is disposed on a contact surface 221 of the laminate substrate 200, and the solder 300 is disposed between the power semiconductor package signal connection component 100a and the laminate substrate 200.

In detail, the semiconductor module 10 of the embodiment is, for example, a power module, but not limited thereto. As shown in FIG. 1, the laminate substrate 200 of the embodiment includes an insulation layer 210, a wiring layer 220, and a metal layer 230. The insulation layer 210 has a first surface 211 and a second surface 213 opposite to each other. The wiring layer 220 is disposed on the first surface 211 of the insulation layer 210 and has the contact surface 221. The metal layer 230 is disposed on the second surface 213 of the insulation layer 210. Here, the laminate substrate 200 is, for example, a direct bonded copper (DBC) substrate, but not limited thereto. In an embodiment, the insulation layer 210 may also be replaced by a ceramic substrate.

Next, please refer to FIG. 1 and FIG. 2A at the same time. The power semiconductor package signal connection component 100a of the embodiment includes a cylinder 110 and two bases 120 and 130. The cylinder 110 has a first through hole 115, which means that the cylinder 110 is embodied as a hollow cylinder. The bases 120 and 130 are connected to opposite sides of the cylinder 110, respectively. As shown in FIG. 2A, an extension direction L1 of the cylinder 110 is substantially perpendicular to an extension direction L2 of the bases 120 and 130. The shapes of the bases 120 and 130 are, for example, disc-shaped. A peripheral edge S2 of the base 120 and a peripheral edge S1 of the cylinder 110 are separated by a horizontal distance D1, and a peripheral edge S3 of the base 130 and the peripheral edge S1 of the cylinder 110 are separated by a horizontal distance D2. That is to say, the shapes of the cylinder 110 and the bases 120 and 130 in the embodiment are, for example, I-shaped. The material of the power semiconductor package signal connection component 100a is, for example, metal or alloy, such as copper or copper alloy, but not limited thereto.

Further, please refer to FIG. 1, FIG. 2A, and FIG. 2B at the same time. The base 120 of the embodiment includes a continuous protrusion pattern 122 and has a flat surface 121, a curved surface 123, and a second through hole 125. The flat surface 121 is connected to the curved surface 123, and a first side E1 of the curved surface 123 is connected to the cylinder 110. The second through hole 125 runs through the curved surface 123 and communicates with the first through hole 115. The continuous protrusion pattern 122 is connected to a second side E2 of the curved surface 123 and is located on the flat surface 121, which means that the continuous protrusion pattern 122 and the flat surface 121 may form a concave-convex surface. Furthermore, there is a height difference H1 between the first side E1 and the second side E2 of the curved surface 123 in the embodiment. The side of the continuous protrusion pattern 122 away from the curved surface 123 is presented as an arc profile, such as an arc hexagram, but not limited thereto. The continuous protrusion pattern 122 includes multiple protrusion portions 124 and multiple connecting portions 126. The protrusion portions 124 and the connecting portions 126 are alternately connected to form a continuous pattern. Here, the protrusion portions 124 of the continuous protrusion pattern 122 of the base 120 and the peripheral edge S2 of the base 120 are arranged at intervals. That is to say, since the edges of the protrusion portions 124 do not touch the peripheral edge S2 of the base 120, the continuous protrusion pattern 122 is closer to the second through hole 125, and the flat surface 121 without the continuous protrusion pattern 122 is closer to the peripheral edge S2 of the base 120, thereby forming a concave-convex surface with inner convex and outer concave.

Similarly, please refer to FIG. 1 and FIG. 2C. The base 130 includes a continuous protrusion pattern 132 and has a flat surface 131, a curved surface 133, and a second through hole 135. The flat surface 131 is connected to the curved surface 133, and a first side E3 of the curved surface 133 is connected to the cylinder 110. The second through hole 135 runs through the curved surface 133 and communicates with the first through hole 115. The continuous protrusion pattern 132 is connected to a second side E4 of the curved surface 133 and is located on the flat surface 131, which means that the continuous protrusion pattern 132 and the flat surface 131 may form a concave-convex surface. Furthermore, there is a height difference H2 between the first side E3 and the second side E4 of the curved surface 133 in the embodiment. The side of the continuous protrusion pattern 132 away from the curved surface 133 is presented as an arc profile, such as an arc hexagram, but not limited thereto. The continuous protrusion pattern 132 includes multiple protrusion portions 134 and multiple connecting portions 136. The protrusion portions 134 and the connecting portions 136 are alternately connected to form a continuous pattern. Here, the protrusion portions 134 of the continuous protrusion pattern 132 of the base 130 and the peripheral edge S3 of the base 130 are arranged at intervals. That is to say, since the edges of the protrusion portions 134 do not contact the peripheral edge S3 of the base 130, the continuous protrusion pattern 132 is closer to the second through hole 135, and the flat surface 131 without the continuous protrusion pattern 132 is closer to the peripheral edge S3 of the base 130, thereby forming a concave-convex surface with inner convex and outer concave.

Please refer to FIG. 1 again. The solder 300 is disposed between one of the two bases 120 and 130 (such as the base 130) of the power semiconductor package signal connection component 100a and the laminate substrate 200. The continuous protrusion pattern 132 of the base 130 may directly contact the solder 300 and the continuous protrusion pattern 132 and the laminate substrate 200 are arranged at intervals. Since the continuous protrusion pattern 132 and the flat surface 131 of the embodiment may form a concave-convex surface with inner convex and outer concave, when the continuous protrusion pattern 132 of the base 130 contacts the solder 300, the thickness of the solder 300 between the flat surface 131 of the base 130 and the laminate substrate 200 may be increased. Furthermore, the design of the curved surface 133 having the height difference H2, the continuous protrusion pattern 132, and the flat surface 131 may also avoid/reduce the solder from entering the cylinder 110, which enables the subsequent external terminals (not shown) to pass through the cylinder 110 and be electrically connected to the laminate substrate 200. In addition, since the continuous protrusion pattern 132 is closer to the second through hole 135 (that is, located on the inner side), when the power semiconductor package signal connection component 100a is deformed by heat, the solder 300 below may bear less stress, which may enable the semiconductor module 10 of the embodiment to have a more favorable structural reliability.

It must be noted here that the following embodiments continues to use the referential numbers of the components and a part of the contents of the previous embodiments, wherein the same referential numbers are used to denote the same or similar components, and the description of the same technical content is omitted. For the description of the omitted part, reference may be made to the foregoing embodiments, and the details are not repeated here.

Figure 3:
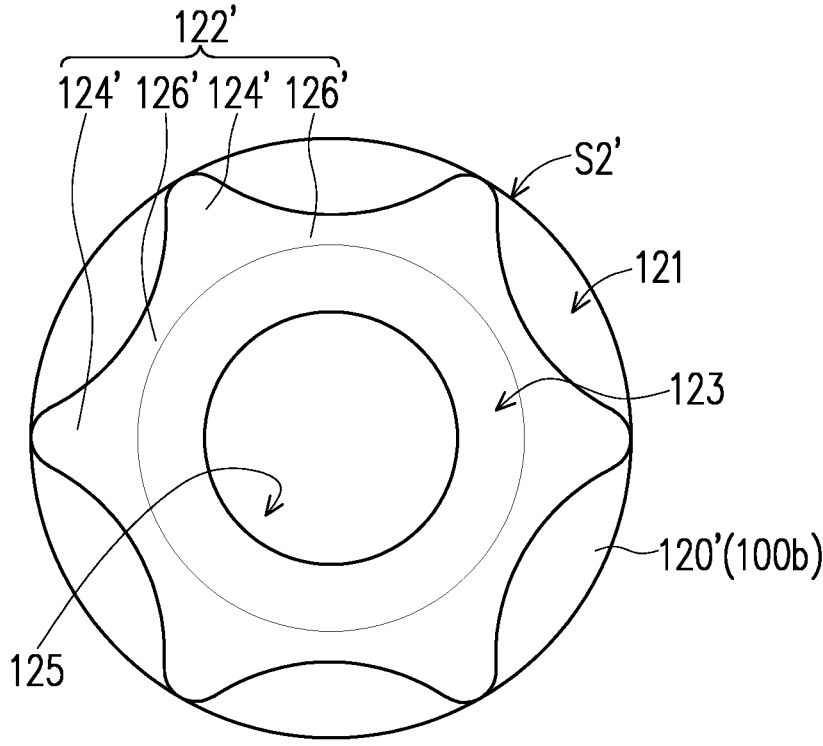
FIG. 3 is a schematic top view of a power semiconductor package signal connection component according to an embodiment of the disclosure.

FIG. 3 is a schematic top view of a power semiconductor package signal connection component according to an embodiment of the disclosure. Please refer to FIG. 2B and FIG. 3 at the same time. A power semiconductor package signal connection component 100b of the embodiment is similar to the power semiconductor package signal connection component 100a of FIG. 2B. The difference between the two is that in the embodiment, a continuous protrusion pattern 122' of a base 120' includes multiple protrusion portions 124' and multiple connecting portions 126'. The protrusion portions 124' and the connecting portions 126' are alternately connected to form a continuous pattern, and the protrusion portions 124' are connected to a peripheral edge S2' of the base 120'. That is to say, the continuous protrusion pattern 122' of the embodiment occupies a larger area than the flat surface 121 without the continuous protrusion pattern 122'. However, the continuous protrusion pattern 122' is still closer to the second through hole 125, and the flat surface 121 without the continuous protrusion pattern 122' is closer to the peripheral edge S2' of the base 120', thereby forming a concave-convex surface with inner convex and outer concave.

To sum up, in the power semiconductor package signal connection component of the disclosure, the base includes the continuous protrusion pattern. The continuous protrusion pattern is connected to the curved surface and is located on the flat surface. That is, the dispositions of the continuous protrusion pattern and the flat surface enable the base to have a concave-convex plane with inner convex and outer concave. Therefore, when the solder is placed between the base of the power semiconductor package signal connection component and the laminate substrate in subsequent applications, the concave-convex plane may not only increase the thickness of the solder between the power semiconductor package signal connection component and the laminate substrate, but also reduce/avoid the solder from entering the cylinder and reduce the stress on the solder. Thus, the power semiconductor package signal connection component of the disclosure may effectively increase the thickness of the solder in subsequent applications, and the semiconductor module using the power semiconductor package signal connection component of the disclosure may have a more favorable structural reliability.

Although the disclosure has been described with reference to the embodiments above, the embodiments are not intended to limit the disclosure. Any person skilled in the art can make some changes and modifications without departing from the spirit and scope of the disclosure. Therefore, the scope of the disclosure will be defined in the appended claims.

What is claimed is:

1. A power semiconductor package signal connection component, comprising:
   a cylinder, having a first through hole; and
   two bases, disposed on opposite sides of the cylinder respectively, wherein each base comprises a continuous protrusion pattern and has a flat surface, a curved surface, and a second through hole, the flat surface is connected to the curved surface, a first side of the curved surface is connected to the cylinder, the second through hole runs through the curved surface and communicates with the first through hole, and the continuous protrusion pattern is connected to a second side of the curved surface and is located on the flat surface, and the continuous protrusion pattern is presented as an arc hexagram.

2. The power semiconductor package signal connection component according to claim 1, wherein the continuous protrusion pattern comprises a plurality of protrusion portions and a plurality of connecting portions, and the protrusion portions and the connecting portions are alternately connected to form a continuous pattern.

3. The power semiconductor package signal connection component according to claim 2, wherein the protrusion portions of the continuous protrusion pattern of each base and a peripheral edge of each base are arranged at intervals.

4. The power semiconductor package signal connection component according to claim 2, wherein the protrusion portions of the continuous protrusion pattern of each base are connected to a peripheral edge of each base.

5. The power semiconductor package signal connection component according to claim 1, wherein a side of the continuous protrusion pattern away from the curved surface is presented as an arc profile.

6. The power semiconductor package signal connection component according to claim 1, wherein an extension direction of the cylinder is perpendicular to an extension direction of each base.

7. The power semiconductor package signal connection component according to claim 1, wherein a peripheral edge of each base and a peripheral edge of the cylinder are separated by a horizontal distance.

8. The power semiconductor package signal connection component according to claim 1, wherein there is a height difference between the first side and the second side of the curved surface.

9. A semiconductor module, comprising:

a laminate substrate, having a contact surface;

a power semiconductor package signal connection component, disposed on the contact surface of the laminate substrate, wherein the power semiconductor package signal connection component comprises:

a cylinder, having a first through hole; and two bases, disposed on opposite sides of the cylinder respectively, wherein each base comprises a continuous protrusion pattern and has a flat surface, a curved surface, and a second through hole, the flat surface is connected to the curved surface, a first side of the curved surface is connected to the cylinder, the second through hole runs through the curved surface and communicates with the first through hole, and the continuous protrusion pattern is connected to a second side of the curved surface and is located on the flat surface, and the continuous protrusion pattern is presented as an arc hexagram; and a solder, disposed between one of the two bases of the power semiconductor package signal connection component and the laminate substrate, wherein the continuous protrusion pattern of one of the two bases directly contacts the solder and the continuous protrusion pattern and the laminate substrate are arranged at intervals.

10. The semiconductor module according to claim 9, wherein the laminate substrate comprises:

an insulation layer, having a first surface and a second surface opposite to each other;

a wiring layer, disposed on the first surface of the insulation layer and having the contact surface; and a metal layer, disposed on the second surface of the insulation layer.

* * * * *